United States Patent
Standing

(10) Patent No.: US 8,786,072 B2
(45) Date of Patent: Jul. 22, 2014

(54) SEMICONDUCTOR PACKAGE

(75) Inventor: Martin Standing, Kent (GB)

(73) Assignee: International Rectifier Corporation, El Segundo, CA (US)

( * ) Notice: Subject to any disclaimer, the term of this patent is extended or adjusted under 35 U.S.C. 154(b) by 734 days.

(21) Appl. No.: 12/037,557

(22) Filed: Feb. 26, 2008

(65) Prior Publication Data
US 2008/0230889 A1 Sep. 25, 2008

Related U.S. Application Data

(60) Provisional application No. 60/891,818, filed on Feb. 27, 2007, provisional application No. 60/891,811, filed on Feb. 27, 2007.

(51) Int. Cl.
*H01L 23/48* (2006.01)
*H01L 23/12* (2006.01)

(52) U.S. Cl.
USPC ............. 257/693; 257/701; 257/E23.019; 257/E23.142

(58) Field of Classification Search
USPC .............. 257/678, 687, E21.499, 693, 701, 257/E23.019, E23.142, 76, 213, 528, 723, 257/E27.011, E27.014, E29.089, E29.242
See application file for complete search history.

(56) References Cited

U.S. PATENT DOCUMENTS

| | | | |
|---|---|---|---|
| 5,789,815 A * | 8/1998 | Tessier et al. | 257/723 |
| 6,617,695 B1 | 9/2003 | Kasatani | |
| 6,639,324 B1 * | 10/2003 | Chien | 257/778 |
| 6,673,484 B2 | 1/2004 | Matsuura | |
| 7,049,692 B2 | 5/2006 | Nishimura | |
| 7,088,004 B2 | 8/2006 | Standing | |
| 7,638,818 B2 | 12/2009 | Wu | |
| 2001/0048116 A1 | 12/2001 | Standing et al. | |
| 2005/0051907 A1 | 3/2005 | Li et al. | |
| 2005/0161706 A1 | 7/2005 | Sutardja | |
| 2006/0043550 A1 * | 3/2006 | Zhuang | 257/678 |
| 2006/0186524 A1 * | 8/2006 | Aiba et al. | 257/686 |

FOREIGN PATENT DOCUMENTS

WO WO 2004/034428 4/2004

OTHER PUBLICATIONS

International Search Report issued Jun. 20, 2008 in corresponding PCT Application No. PCT/US0802627.
High Current Voltage Regulator Module Employs Novel Packaging Technology to Achieve Over 100A in a Compact Footprint to Power Next Generation Servers, Carl Blake, Ralph Monteiro and Andrew Sawle, International Rectifier, El Segundo, CA presented at PCIM Europe 02.

* cited by examiner

*Primary Examiner* — Matthew W Such
*Assistant Examiner* — Monica D Harrison
(74) *Attorney, Agent, or Firm* — Farjami & Farjami LLP

(57) ABSTRACT

A semiconductor package that includes a substrate having a metallic back plate, an insulation body and a plurality of conductive pads on the insulation body, and a semiconductor die coupled to said conductive pads, the conductive pads including regions readied for direct connection to pads external to the package using a conductive adhesive.

13 Claims, 14 Drawing Sheets

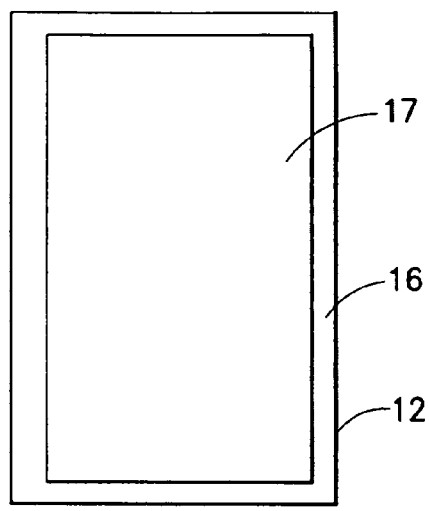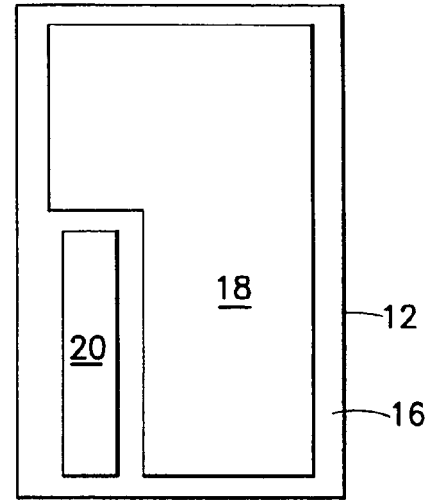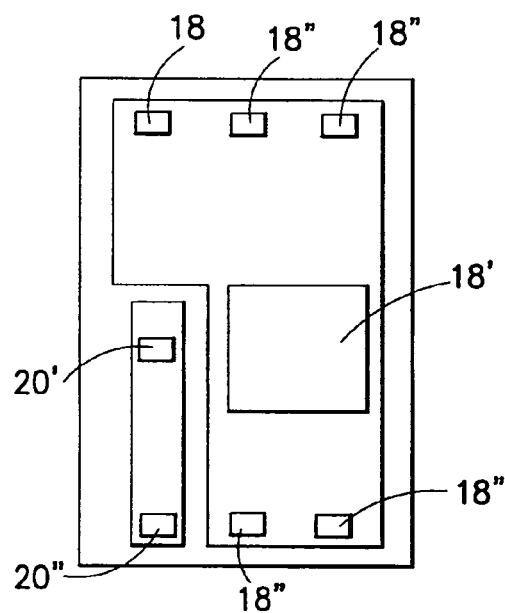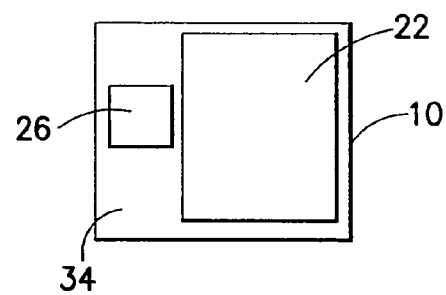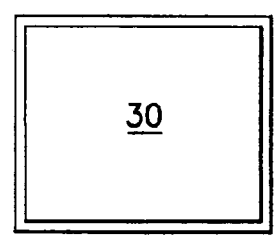
FIG.2A  FIG.2B  FUIG.2C  FIG.2D  FIG.2E

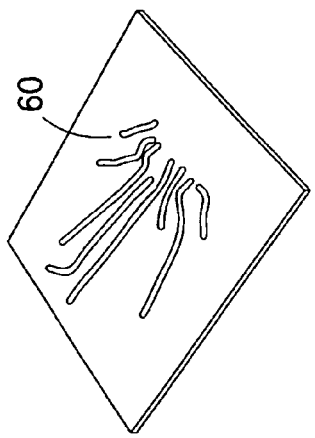
FIG.7D
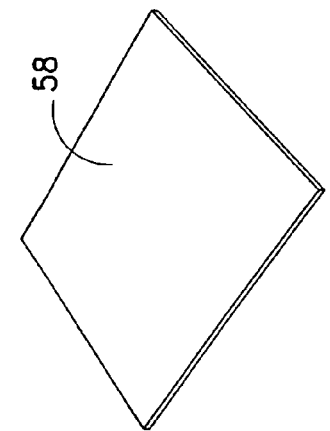
FIG.7C
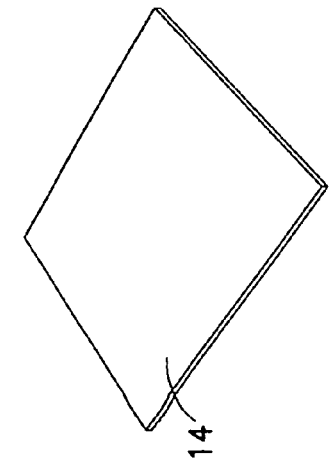
FIG.7B
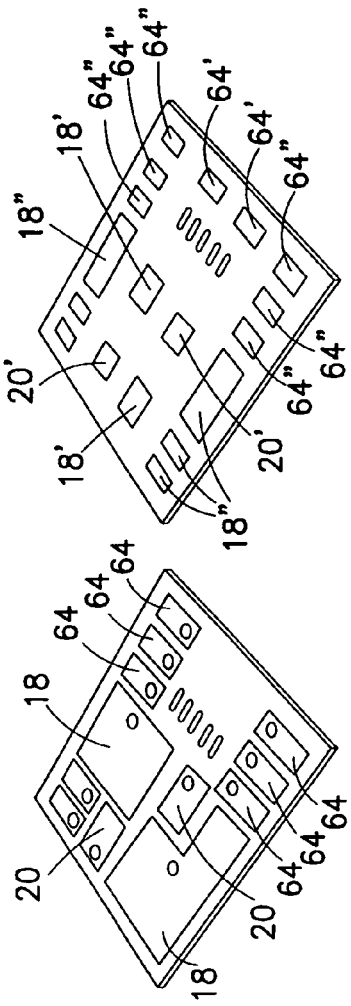
FIG.7G
FIG.7F
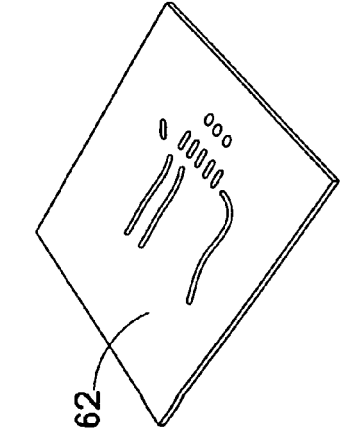
FIG.7E

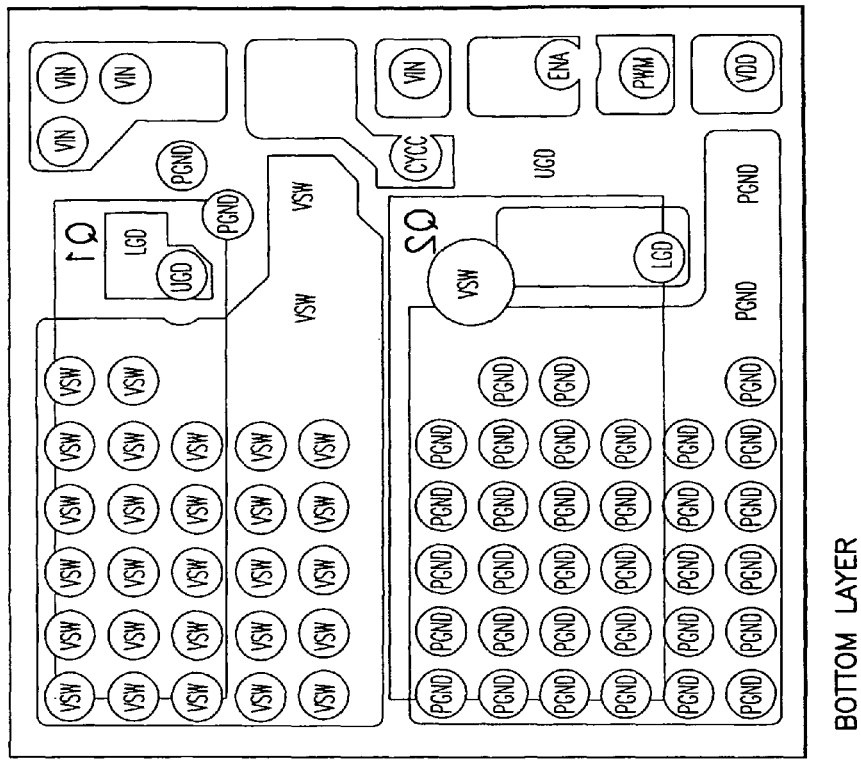
FIG. 11D BOTTOM LAYER
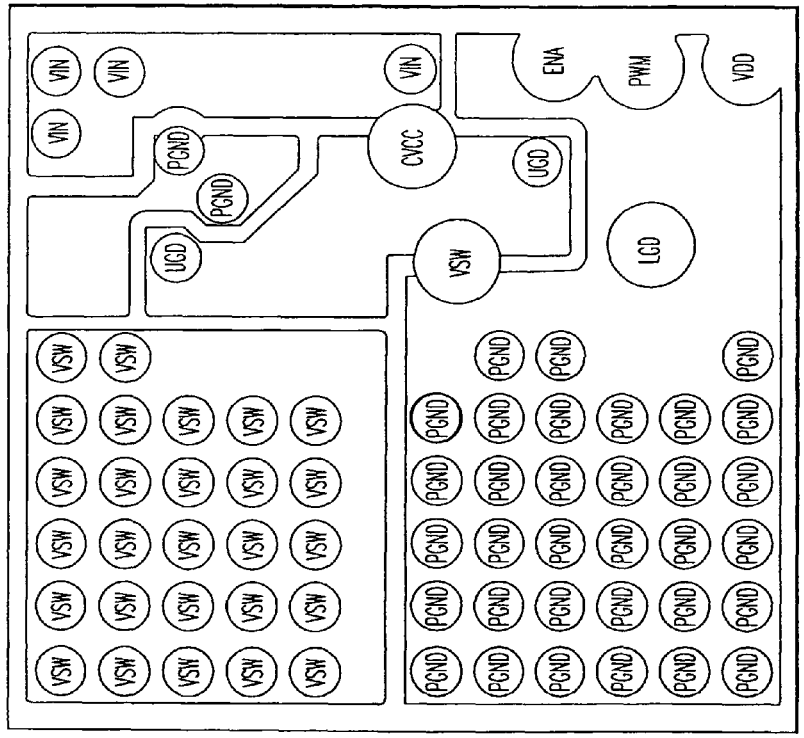
FIG. 11C LAYER3

SEMICONDUCTOR PACKAGE

CLAIM OF PRIORITY

The present application is based on and claims priority to U.S. Provisional Patent Application Ser. Nos. 60/891,818, filed on Feb. 27, 2007, entitled ORCA PACKAGING CONCEPT and 60/891,811, filed on Feb. 27, 2007, entitled ORCA MODULE ADAPTER, the entire disclosures of which are incorporated by reference.

BACKGROUND OF THE INVENTION

The present application relates to semiconductor packages.

Not to long ago a 30V synchronous FET die would have been approximately 15 mm squared for a given performance. The same performance can probably be matched by a die of approximately 9 mm squared or less with the available technology today. For electrical and thermal performance the most efficient packaging solution is a direct connection (using solder or the like) of a large cross-sectional area to an external pad of, for example, a circuit board. However, problems may arise as the die is reduced in size. For example, there will be design constraints based on what is possible to achieve in terms of distances between pads to prevent shorting, which may mean that large cross-sectional area joints are not always achievable.

In addition, the move by the industry to the use of lead-free assembly processes has resulted in detrimental residuals when assembling a die on a PCB using a lead-free solder. The gate and the source side of a semiconductor die are the areas most sensitive to contamination by lead-free solders.

Moreover, as the die gets thinner it becomes more and more difficult to solder a die directly to a PCB and yield a reliable assembly. This is especially true in applications where large die are used, such as IGBTs for automotive applications in hybrid and electric cars.

Not only is there a question of mechanical damage to the die by soldering the die directly to the PCB, there are questions over metalisations as well. Before the switch to lead-free assembly, there was ample data on how a die would react to being soldered. Data regarding the use of lead-free solder is not yet as available. For example, while it is known that the alloys being used for lead-free PCB assembly increase the consumption of the metalisation during soldering to levels not seen before, little is known about long term consumption.

Furthermore, tracking distances imposed by higher voltages pose some very different problems for a package. Thus, there is a necessity to separate the connections of dissimilar polarities by a large enough distance to meet the surface tracking distances given by standards such as UL840, which causes real issues for packages based on a fixed framework such as a can or a lead frame.

SUMMARY OF THE INVENTION

A package according to the present invention uses a substrate as a packaging medium to address many of the challenges of packaging of power semiconductors.

More specifically, a package according to the present invention includes a semiconductor die that includes a first electrode on a surface thereof, a support plate having a first surface and a second surface opposite the first surface, an insulation body disposed on the first surface of the support plate; and a plurality of laterally spaced conductive pads on the insulation body, a first one of the conductive pads including a first region electrically and mechanically coupled to the first electrode with a conductive adhesive body interposed between the first electrode and the first region and a second region readied for connection using a conductive adhesive body to a conductive pad external to the package.

Other features and advantages of the present invention will become apparent from the following description of the invention which refers to the accompanying drawings.

BRIEF DESCRIPTION OF THE DRAWINGS

FIGS. 2A-2C illustrate steps in the fabrication of a package according to the first embodiment.

FIGS. 2D and 2E illustrate front and back views respectively of a semiconductor die that could be used in a package according to the present invention.

FIGS. 7B-7G illustrate steps in the fabrication of a package according to the fifth embodiment.

FIGS. 11A-11D illustrate four level metalizations which may be used in embodiments that include an integrated IC die.

DETAILED DESCRIPTION OF THE PREFERRED EMBODIMENTS OF THE INVENTION

First Embodiment

Figures 1A, 1B:
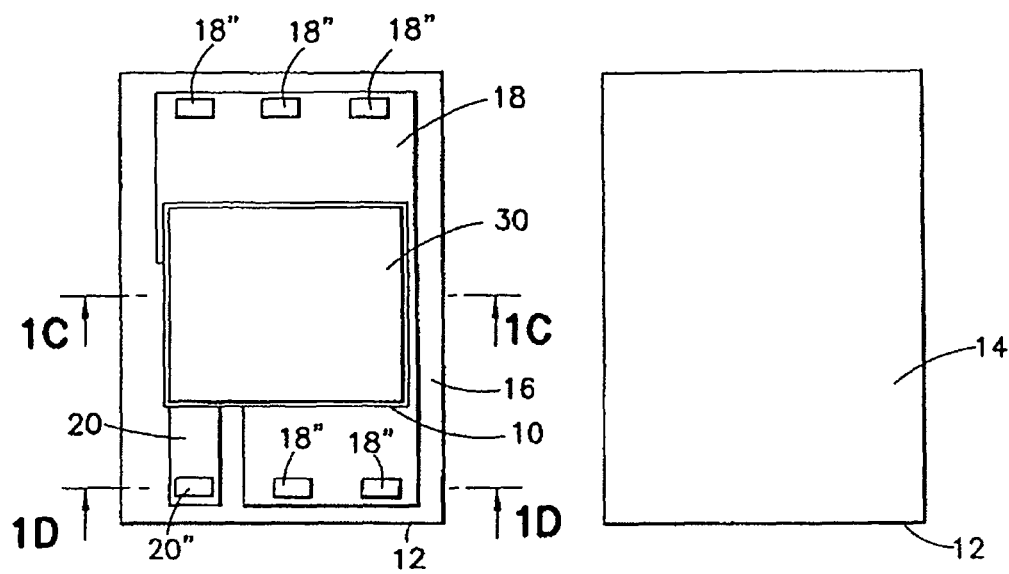
FIG. 1A shows a top plan view of a package according to the first embodiment.
FIG. 1B shows a bottom plan view of a package according to the first embodiment.
Figure 1C:
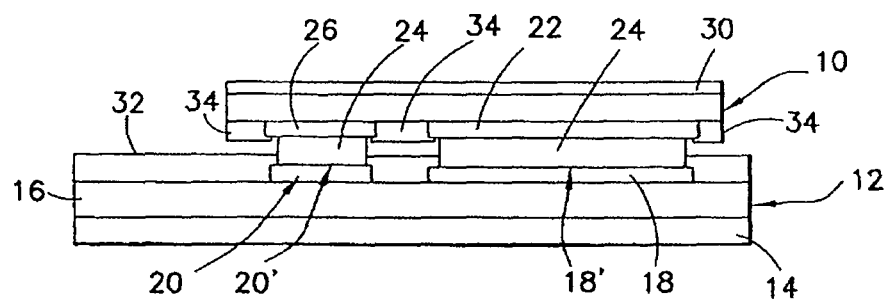
FIG. 1C shows a cross-sectional view along line 1C-1C viewed in the direction of the arrows.
Figure 1D:
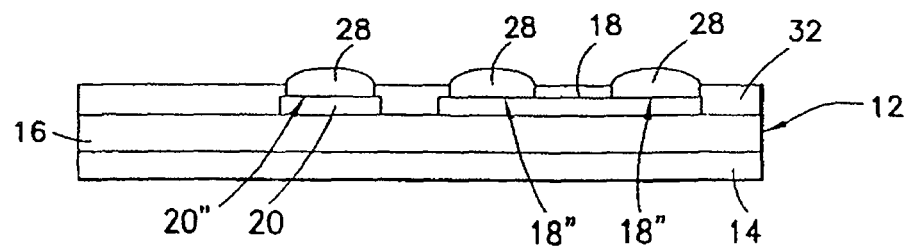
FIG. 1D shows a cross-sectional view along line 1D-1D viewed in the direction of the arrows.

Referring to FIGS. 1A-1D, a semiconductor package according to the first embodiment of the present invention includes a semiconductor die 10 (e.g. a power MOSFET or an IGBT), and a substrate 12. Substrate 12 includes a support plate 14, which may be a copper plate, an insulation/dielectric body 16 (e.g. FR4) formed on a first surface of copper plate 14, and a plurality of laterally spaced conductive (e.g., copper) pads 18, 20 on insulation body 16. Each conductive pad 18, 20 includes a first region 18', 20' which is electrically and mechanically coupled to a respective electrode of semiconductor 10 using a conductive adhesive such as solder or a conductive epoxy. Thus, region 18' is coupled to power electrode (e.g., source electrode) 22 of semiconductor die 10 using a solder body 24, and region 20' is coupled to gate electrode 26 of semiconductor die 10 using solder 24 or the like. Each conductive pad 18, 20 further includes a second region 18", 20" which is readied for connection using a conductive adhesive body to a conductive pad external to said package. Thus, regions 18", 20" may be rendered solderable so that a package according to the present invention can be solder mounted to conductive pads of another circuit board through regions 18", 20" or to pads of a lead frame or the like. In a preferred embodiment, solder bumps 28 may be pre-applied to regions 18", 20" to enable easier mounting of the package to external pads.

In the first embodiment of the present invention, another power electrode (e.g., drain electrode) 30 of semiconductor die 10 may be also readied for direct electrical and mechanical connection to a conductive pad external to the package. Thus, drain electrode 30 may be rendered solderable. Note that in the preferred embodiment, except for regions 18', 18", 20', 20", the remaining surface area of pads 18, 20 is covered with a passivation body 32 (rendered transparent in FIG. 1A for better illustration), which may also serve as a solder resist. Furthermore, preferably, a passivation body 34 is applied to the front face of die 10 except for areas that are coupled to respective regions 18', 20'.

Referring now to FIGS. 2A-2E, a package according to the present invention is fabricated by starting with a substrate 12 that includes support plate 14, insulation body 16, and copper body 17 on insulation body 16 (FIG. 2A). Thereafter, copper body 17 is patterned to obtain spaced pads 18, 20 (FIG. 2B) using any desirable method. Next, passivation body 32 is applied over pads 18, 20, and patterned to obtain openings over regions 18', 18", 20', 20". Thereafter, either solder or conductive epoxy is applied to source 22 and gate 26 electrodes (preferred method) or solder or a conductive epoxy is applied to regions 18', 20', and die 10 is mounted such that source electrode 22 registers with region 18' and gate electrode 26 registers with region 20'. Then, in a thermal step the applied solder is reflown or the applied epoxy is cured. Optionally, solder bumps may be then applied to region 18", 20" to obtain a device according to the first embodiment of the present invention.

Second Embodiment

Referring to FIGS. 3A-3E, in which the like numerals identify like features, in a package according to the second embodiment, conductive pads 18, 20 extend beyond the peripheral boundary of insulation body 16. Furthermore, in a package according to the second embodiment a conductive pad 36 is provided to serve as an external connection lead for drain electrode 30 of die 10. More specifically, conductive clip/strap (e.g., copper strap) 38 is coupled using a conductive adhesive (e.g., solder or the like) to drain electrode 30 and a first region 36' of conductive pad 36. An underfilling ring 40 may be disposed around die 10 and between the bottom of strap 38 and substrate 12 to enclose the space around die 10 for additional protection of the die and for improved mechanical integration of strap 38.

According to an aspect of the invention, in the second embodiment, second regions 18", 20", and 36" are located on a surface opposite to first regions 18', 20', 36'. That is, unlike the first embodiment, in which first regions 18', 20' and second regions 18", 20" are disposed on the same surface, in the second embodiment first regions 18', 20' and second regions 18", 20" are on opposite surfaces.

A package according to the second embodiment of the present invention is capable of adaptation for use in many automotive and industrial power modules, which predominantly use copper buzz-bars for the power connections to and from the modules. As the buzz-bars have to be electrically isolated they are generally mounted in a molded plastic framework, which means that there is some movement between the buzz-bars.

There are a number of methods that are used to connect semiconductor die into these types of modules. One that appears to be relatively common in the automotive application area is to bond the die backs (drain if MOSFET or collector if IGBT) to a DBC substrate. The other contacts (gate and source if MOSFET, base and emitter if IGBT) are generally wire-bonded out either to the DBC or to the buzz-bar directly depending on the die and module configuration. In most cases these connections pass through fairly long wire bonds and in some cases even through two sequential wire-bonds.

Wire-bonds are not very good from a performance or a reliability point of view and have been the subject of many proposed product improvements.

A package according to the second embodiment of the present invention can be adapted for mounting between buzz-bars.

Figure 3A:
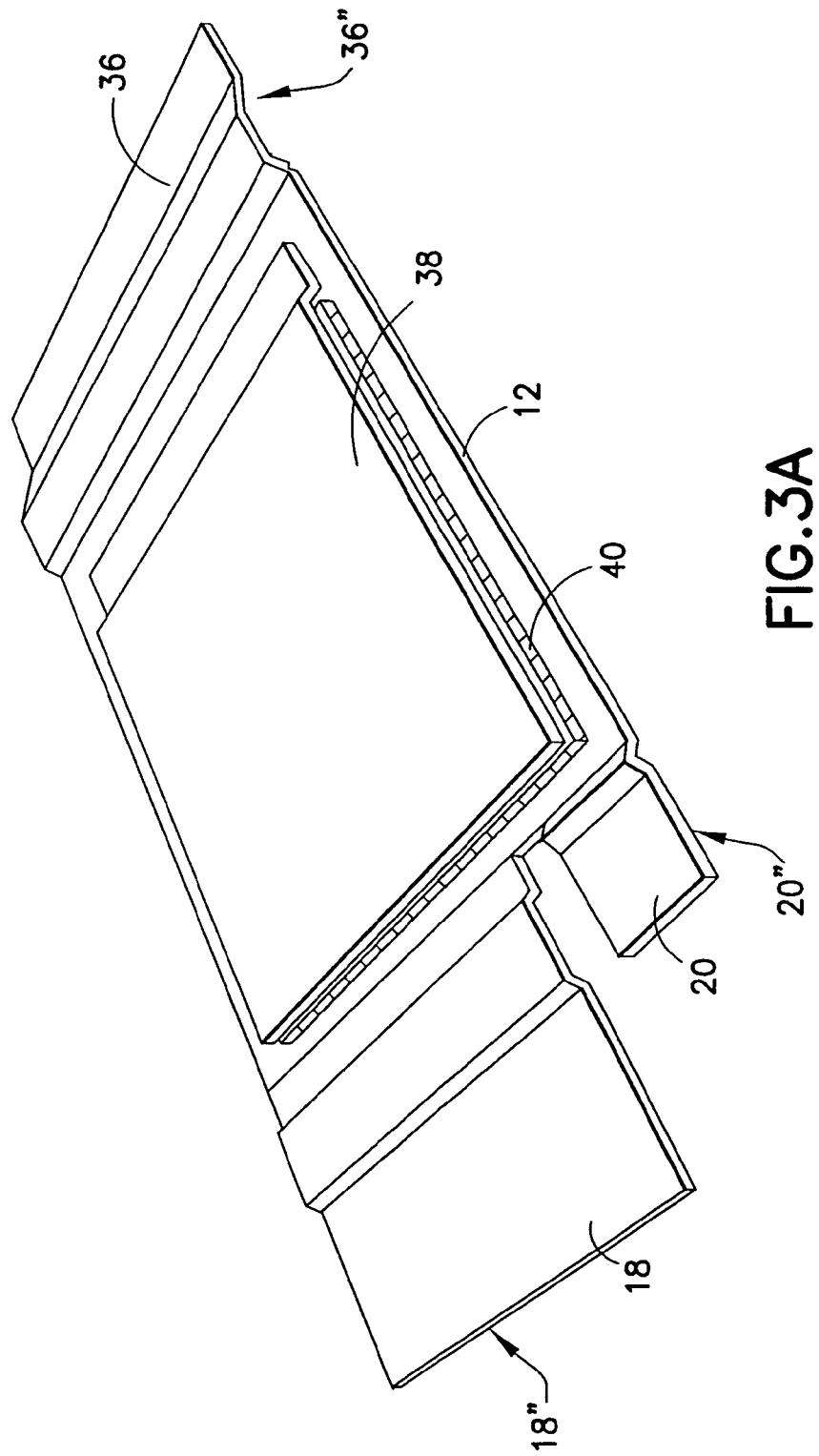
FIG. 3A illustrates a package according to the second embodiment of the present invention.
Figure 3B:
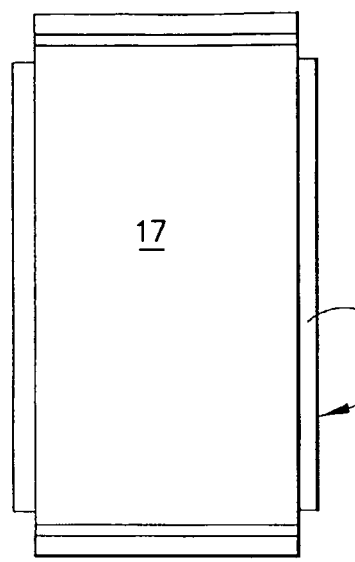
FIGS. 3B-3D illustrate steps in the fabrication of a package according to the second embodiment.
Figure 3C:
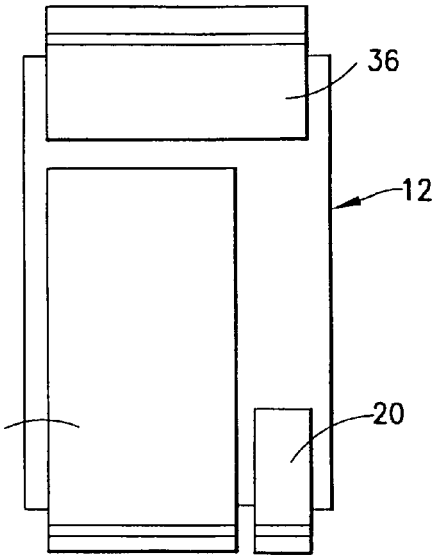
Figure 3D:
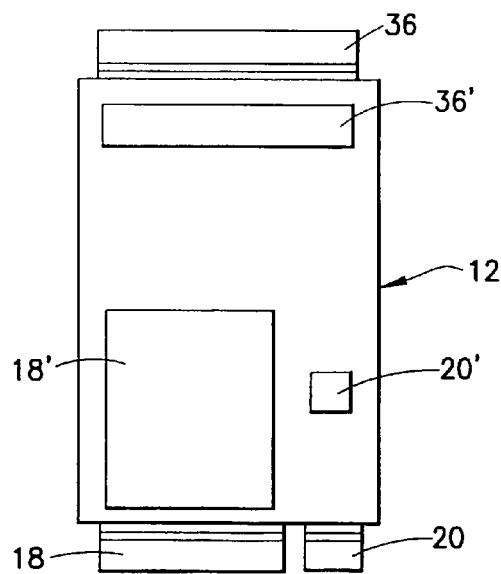
Figure 3E:
FIG. 3E illustrates a side plan view of a clip/strap that can be used in a package according to the second embodiment of the present invention.

Referring now to FIGS. 3B-3E, in which like numerals identify like features, to fabricate a package according to the second embodiment, first a substrate 12 is provided having a copper body 17 which includes oppositely disposed ends that extend beyond opposite edges of insulation body 16 (FIG. 3B). Next, copper body 17 is patterned to obtain laterally spaced conductive pads 18, 20, 36 as illustrated by FIG. 3B. Then, a passivation body 32 is applied over pads 18, 20, 36 and patterned to include openings over first regions 18', 20', 36' as illustrated by FIG. 3D. Next, a die 10 (as illustrated by FIGS. 2D and 2E) is mounted to first regions 18', 20' in the same manner as the first embodiment of the present invention. Thereafter, a conductive adhesive (e.g., solder or a conductive epoxy) is applied to drain electrode 30 and first region 36'. Strap 38 (as illustrated by FIG. 3E) is then placed over drain electrode 30 and first region 36' and heat is applied to reflow the solder or cure the conductive epoxy. Thereafter, underfilling is applied to form underfilling ring 40 around die 10 to obtain a package according to the second embodiment.

The following two methods can be carried out to obtain a device according to the second embodiment.

Method 1

First a large FR4 substrate is provided as a base for the fabrication of a plurality of packages. The FR4 is then punched to define openings under portions of pads 18, 20, 36 that extend outside the edges of each insulation body 16, the openings also defining the outer boundaries of each insulation body 16. Then a copper body 17 is bonded to each insulation body 16. Thereafter, a copper plate 14 is bonded to the surface of each insulation body 16 opposite copper body 17 to obtain a substrate as illustrated by FIG. 3B. Copper body 17 is then patterned, soldermasked with passivation 32, and the areas not covered by passivation 32 are plated with nickel gold. Thereafter, the package is fabricated as set forth above, and singulated from the large FR4 substrate.

Method 2

Alternatively, a large copper foil is etched to include a plurality of copper bodies 17 connected to one another by respective copper tabs. A piece of ceramic serving as insulation body 12 is then bonded to the back of each copper body 17, and each body 17 is patterned. Passivation 32 is then applied and areas not covered by passivation 32 for receiving the electrodes of a respective die are plated with nickel gold. Each package is then fabricated as set forth above and singulated along the tabs in the copper foil.

Both methods of assembly result in the need to cut through copper tabs to singulate. In the case of method 1, it may also be necessary to cut through some thin dielectric material. There are many methods that can be employed for cutting through both of these materials. Options may include laser, water-jet, trim tooling, routing, etc.

Both methods result in a component that may visually looks similar. The difference is that a package fabricated according to the first method will have a copper pad isolated with an FR4 substrate on the back of the component, while a package according to the second method will have a piece of ceramic in place of the FR4 and the copper for isolation and support.

Third Embodiment

Figure 4A:
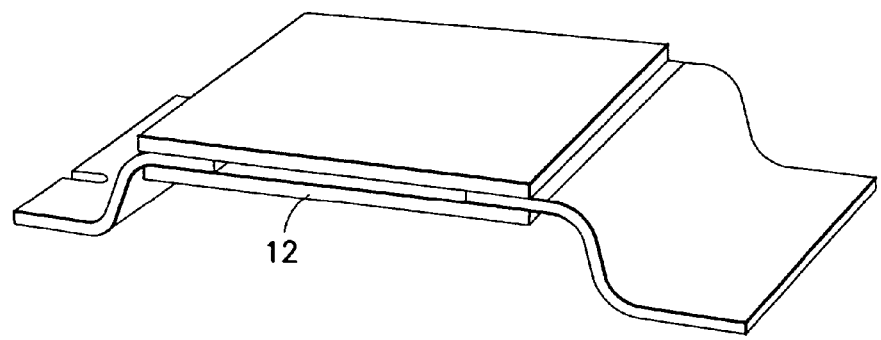
FIG. 4A illustrates a perspective view of a package according to the third embodiment.
Figure 5:
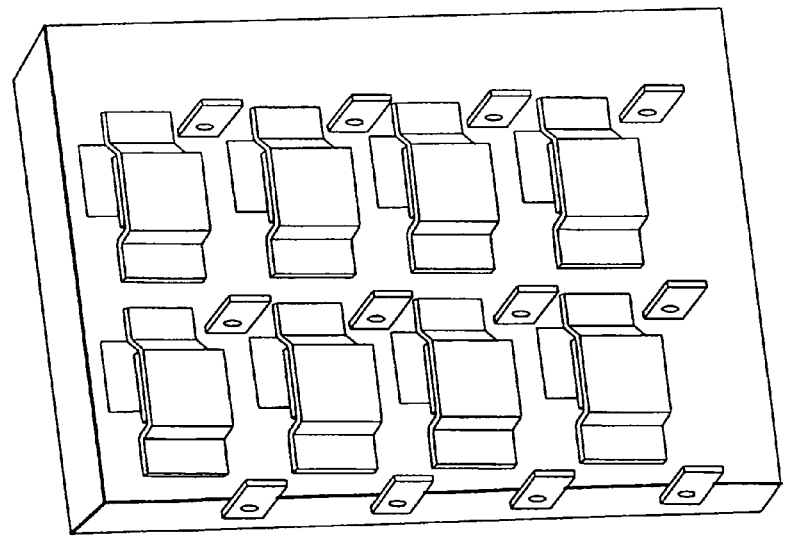
FIG. 5 illustrate a module that includes a package according to the third embodiment.
Figure 4B:
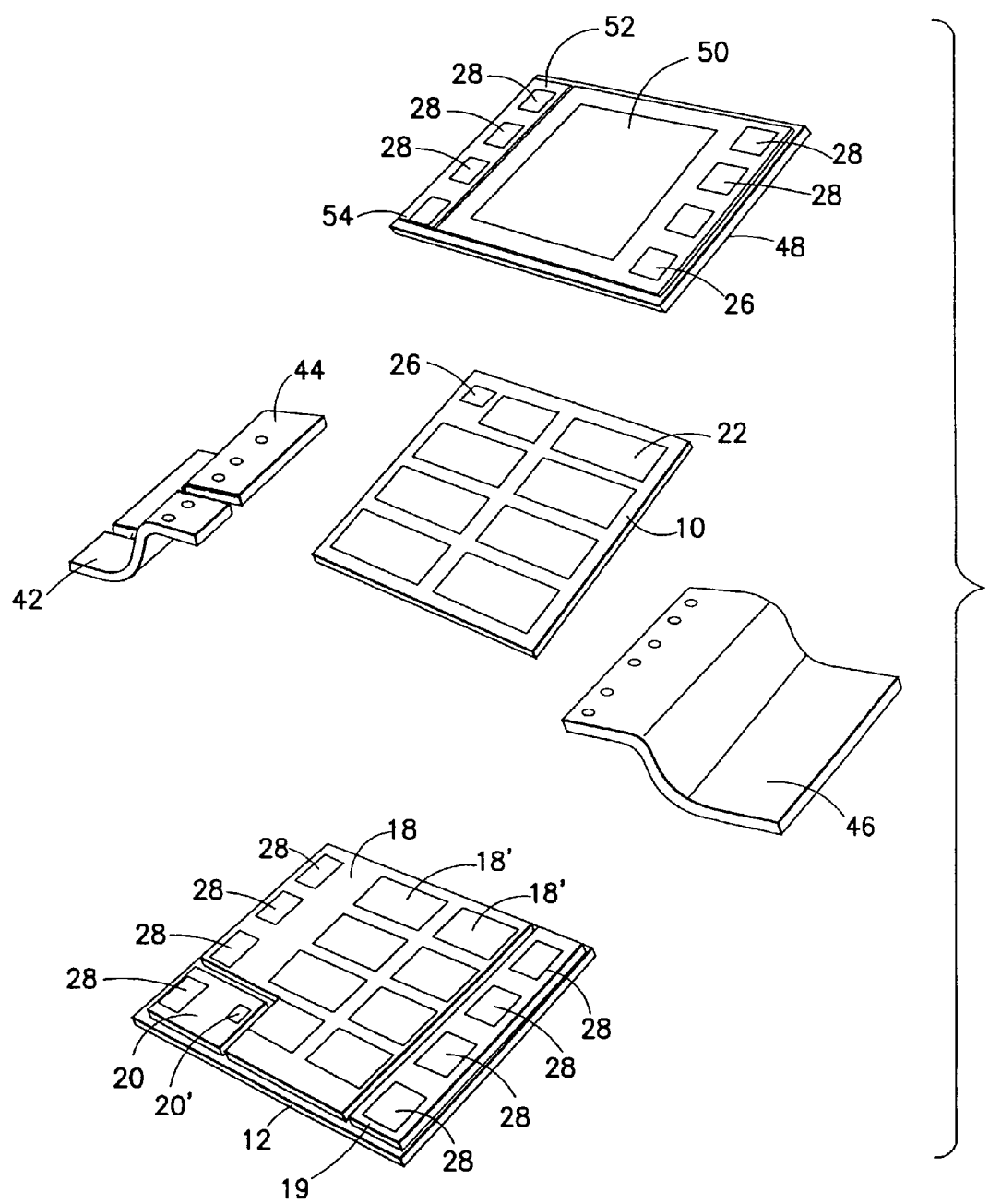
FIG. 4B illustrates a disassembled package according to the third embodiment.

Referring now to FIGS. 4A and 4B, in which like numerals identify like features, a package according to the third embodiment includes a package according to the first embodiment that is integrated with extended leads. Specifically, a substrate 12 is fabricated and a die 10 is mounted thereon in the same manner as the first embodiment. Note that substrate 12 in the third embodiment includes a conductive pad 19 (spaced from the other two pads) for electrical connection to drain electrode 30 of die 10. Conductive pad 19 would also include regions thereon for connection using solder or the like to an external lead. Note that in FIG. 4B solder 28 is shown pre-applied to pad 19. Next, a gate lead 42, a source lead 44, and a drain lead 46 are provided and coupled to respective first regions 18', 20' and drain pad 19 through solder bumps 28. Thereafter, a second substrate 48 is coupled to drain electrode 30 of die 10, and leads 42, 44, 46. Specifically, second substrate 48 includes a drain conductive pad 50 for electrical and mechanical connection using solder or the like conductive adhesive to drain electrode 30 of die 10, gate conductive pad 52 for connection to gate lead 42, and source conductive pad 54 for connection to source lead 44. Note that drain pad 50, gate pad 52, and source pad 54 all may include solder bumps that register with a portion of a respective lead. Thus, second substrate 48 provides for a drain connection to lead 46, and for additional support to the package, as well as heat dissipation from the die. Note that the provision of leads 42, 44, 46 enables a package according to the present invention to be configured for installation as a dual-in-line package on a circuit board or for mounting to buzz-bars. FIG. 5 illustrates how a package according to the third embodiment may be mounted in a power module.

In a package according to the third embodiment, substrate 12 and substrate 48 can be DBC or a substrate that uses a thick-film ceramic instead of FR4. A package according to the third embodiment offers double sided electrical isolation without additional processing.

In the preferred embodiment, the whole assembly could include a filler material injected between the two substrates. A package according to the third embodiment offers substantial savings in the assembly necessary to complete a typical power module. For example, the package can be directly assembled onto buzz-bars using a number of methods that are already used in automotive applications (flame soldering, ultrasonic bonding, laser welding or laser soldering, etc.). Moreover, while the back of the package can be connected directly to a heatsink, the ceramic substrates are likely to result in good thermal performance. Incidentally, a package according to the second embodiment can also receive a heatsink, if a piece of ceramic is bonded to the drain clip thereof, resulting in dual side cooling.

Fourth Embodiment

Figure 6A:
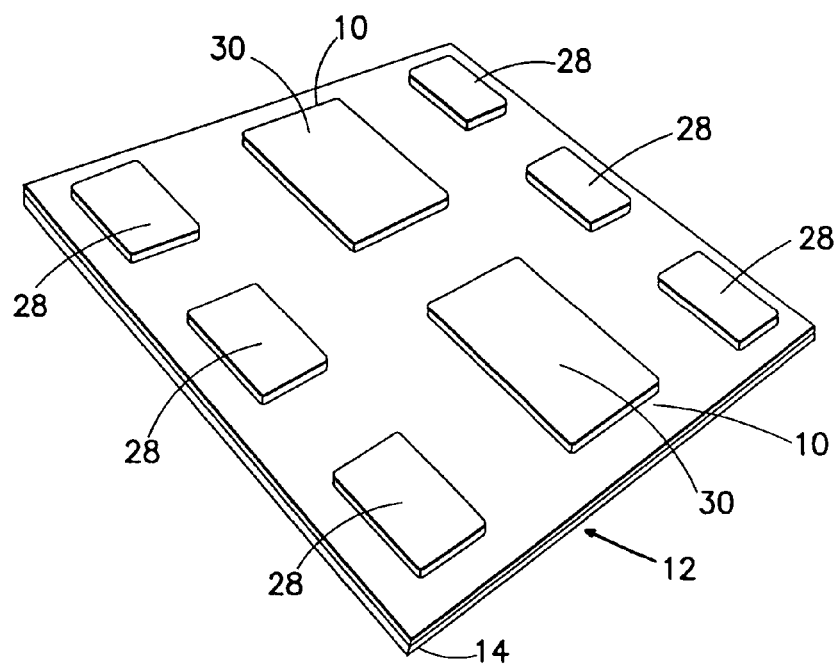
FIG. 6A illustrates a perspective view of a package according to the fourth embodiment.
Figure 6B:
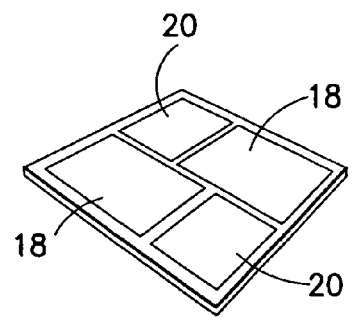
FIG. 6B illustrates a perspective view of a substrate used in a package according to the fourth embodiment.

Referring now to FIGS. 6A and 6B, in which like numerals identify like features, a package according to the fourth embodiment includes two power semiconductor devices (e.g., two power MOSFETs) arranged in the same manner as the first embodiment over a common substrate 12. Thus, as illustrated by FIG. 6B substrate 12 includes two conductive pads 20 each for connection to a gate electrode of a respective semiconductor die 10 and two conductive pads 20 each for connection to the source electrode of a respective semiconductor 10. A package according to the fourth embodiment may be used in a half-bridge configuration (e.g., buck converter or the like). Specifically, when mounted on a circuit board or a lead frame the source electrode of one semiconductor die 10 may be connected to the drain electrode of the other semiconductor die through appropriate connection pads on the circuit board or the lead frame.

Fifth Embodiment

Figure 7A:
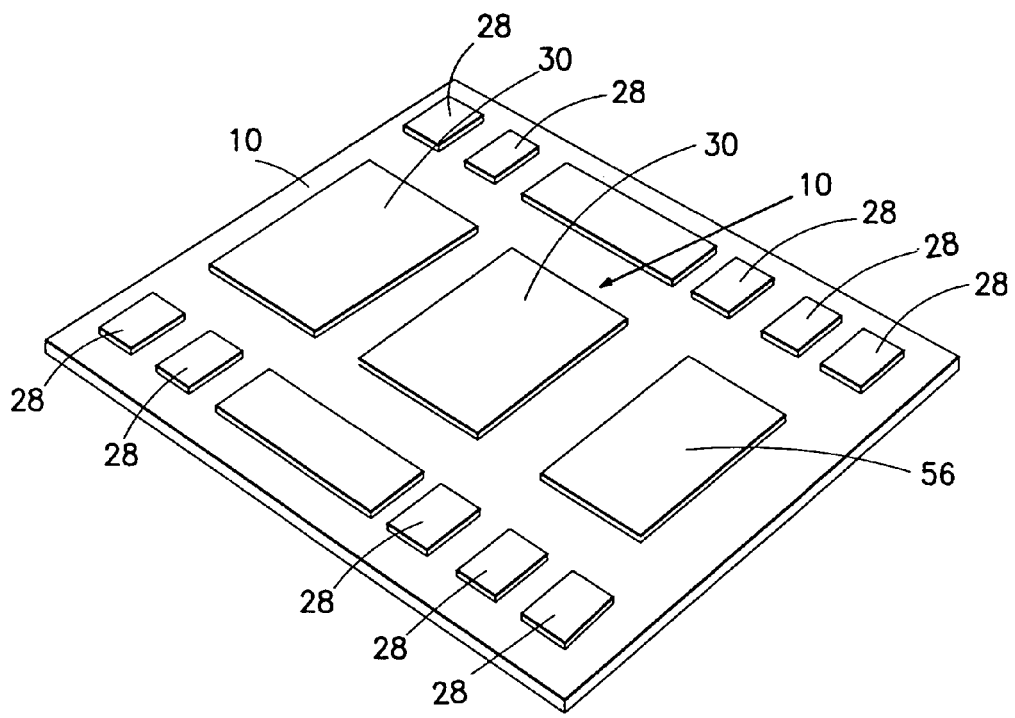
FIG. 7A illustrates a perspective view of a package according to the fifth embodiment.

Referring now to FIG. 7A, in which like numerals identify like features, a package according to the fifth embodiment include two power semiconductor die 10, similar to the fourth embodiment, and an IC die 56 (e.g., a driver IC) for operating semiconductor die 10 all disposed on a common substrate.

Referring now to FIGS. 7B-7G, in which like numerals identify like features, first a copper plate is provided (FIG. 7B), a first insulation body 58 is deposited over a surface of copper plate 14 (FIG. 7C), copper tracks 60 to serve as input/output leads on first insulation body (FIG. 7D) using any suitable method, a second insulation body 62 is deposited over tracks 60 and patterned to include openings over selected regions of tracks 60 (FIG. 7E). The selected regions would serve as connection points to the gate electrodes of semiconductor die 10 and to input/output electrodes of IC 56. Next, conductive copper pads 18, 20 are formed for receiving source and gate electrodes of respective semiconductor die. Furthermore, conductive copper pads 64 are formed and connected through insulation 62 to respective input/output tracks to serve as external connection points for the input/output electrodes of IC 56 (FIG. 7F). Note that conductive pads 20 for connection to the gate electrodes of die 10 would be connected to respective conductive tracks 60 through insulation body 62 and would receive drive signals from IC 56 through the same. Thereafter, a passivation body 32 is applied and patterned (FIG. 7G) to define first and second regions 18', 20', 18", 20" and region 64" for each conductive pad 64 readied for connection using a conductive adhesive to a conductive pad external to the package. Thereafter, IC 56 is assembled on by connecting its input/output electrodes to respective connection regions 64' on respective tracks 60, and die 10 are assembled on in a manner similar to the other embodiments disclosed herein.

In this embodiment, for example, the bottom copper layer 14 can be 6 oz (210 µm), the first insulation body may be 75 µm with ½-1 oz (17-35 µm) copper on top thereof for input/output tracks, insulation body 16 of 75 µm thickness and the final copper layer is again thick 6 oz (210 µm).

Sixth Embodiment

Figure 8A:
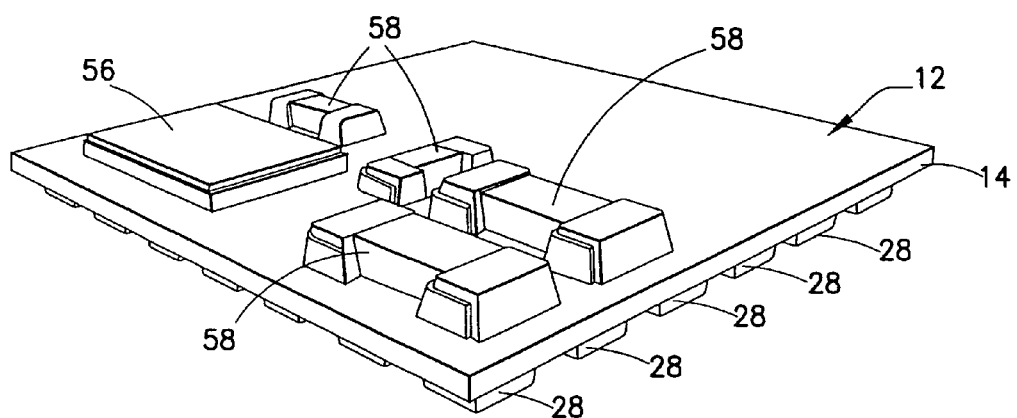
FIG. 8A illustrates a top view of a package according to the sixth embodiment.
Figure 8B:
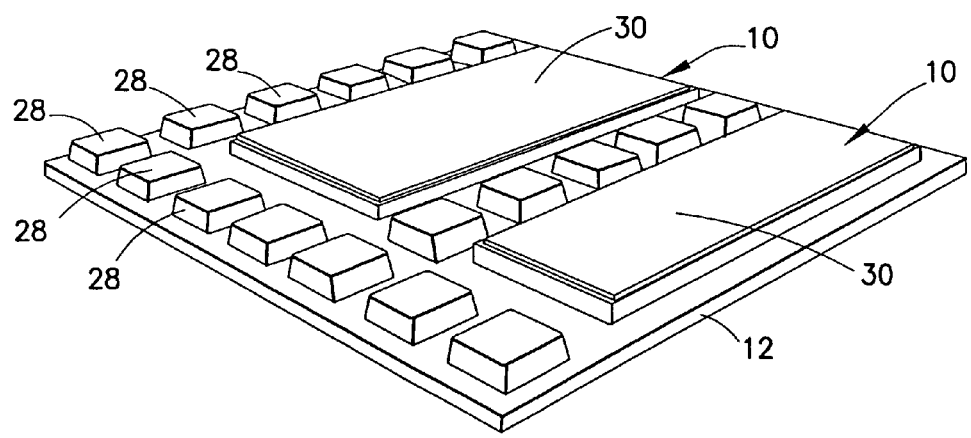
FIG. 8B illustrates a bottom view of a package according to the sixth embodiment.

Referring now to FIGS. 8A and 8B, in which like numerals identify like features, in a package according to the sixth embodiment, power semiconductor die 10 may be assembled in the same manner as the first embodiment on one side of plate 14, while IC 56 may be assembled on an opposite side of plate 14. Furthermore, in addition to IC 56 passive elements (e.g., capacitors, resistors, and the like) 58 can be assembled on the same side as IC 56. Thus, in the sixth embodiment, input/output tracks 60 may be formed over the surface opposite to semiconductor die 10 and connected to conductive pads on the same surface as the die 10 using conductive vias that extend through plate 14. Note that plate 14 in this embodiment may be an insulator such as a ceramic body. In this embodiment, all external connections would be made through pads (which may be provided with solder bumps 28) that reside over the same surface as die 10.

Designs for fifth and sixth embodiments (integrated IC and Power devices) can use several 1 oz copper layers connected together to allow 1 oz copper to be used on the power layer instead of having the signal layer as one of the inner layers and selectively exposing the circuit for IC placement. For example, four 1 oz copper layers can be connected together through drilled and plated vias for the power traces, effectively obtaining power traces equivalent to a 4 oz single layer of copper. FIGS. 11A-11D illustrate an example of such an arrangement.

Seventh Embodiment

Figure 9A:
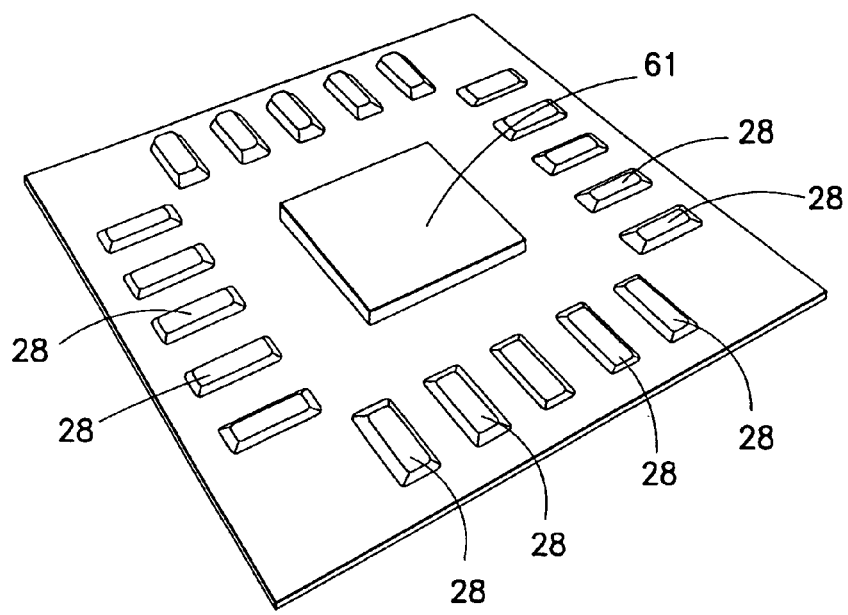
FIG. 9A illustrates a perspective view of a package according to the seventh embodiment.
Figure 9B:
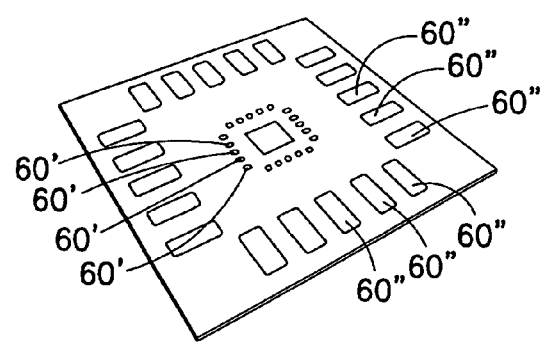
FIG. 9B illustrates a perspective view of a substrate used in a package according to the seventh embodiment.

Referring now to FIGS. 9A and 9B, in which like numerals identify like features, an IC semiconductor die 60 may be used instead of a power semiconductor die. IC 60 may be assembled in the same manner as the first embodiment. Thus, as illustrated by FIG. 9B, a substrate 12 may be prepared that includes a plurality of input/output tracks 60. Each track 60 may include a first region 60' that is electrically and mechanically coupled to a respective input/output electrode of IC 61 using a conductive adhesive (e.g., solder or conductive epoxy) and a second region 60" readied for electrical and mechanical connection using a conductive adhesive to a pad external to the package. In the preferred embodiment, solder bumps 28 may be applied to regions 60" as illustrated by FIG. 9A.

In the fifth, sixth, and seventh embodiments input/output tracks require a much lower weight copper at least for the tracking side of the substrate. In general ICs have a high number of Input/Output contacts on a relatively small die size, which means that the connection cross-sectional area and the pitch between contacts are very small. Fine geometry tracks are required to connect these types of device. To produce these fine geometries may be necessary to use the lower copper weights.

For example, 1 oz copper (35 μm) can be laminated to a thicker dielectric core 100-200 μm to serve as a base for input/output tracks.

The assembly of an IC die on a substrate can be carried out as follows:
  stencil print flux on regions 60'
  place bumped die onto flux
  reflow solder and clean
  dispense loaded epoxy (silver or thermally conductive adhesive; application dependent) on back of die
  bond backplate to die
  cure epoxy
  underfill die and backplate assembly
  cure underfill
  pre-solder regions 60" to provide contacts on a similar plane A package according to the seventh embodiment offers a very simple redistribution solution, which results in a package that is very cost effective against many of the currently available packages.

A substrate 12 in a package according to the present invention can use a very thick copper plate 14 laminated to a very thin dielectric body 16. In the preferred embodiment insulation body 16 (and also first insulation body 58 in the fifth embodiment) is made of an FR4 material. Higher TG (glass transition) materials such as high TG FR4s or polyimide based materials may also be used to form insulation body 16 without deviating from the scope and spirit of the present invention.

For example, a substrate 12 may include 16 oz copper (210 μm) laminated on either side of a 75 μm FR4 core. While the insulation body does not offer any great rigidity to the structure the very thick copper and the design of the layout mean that even very large substrates are not a problem.

Figure 10A:
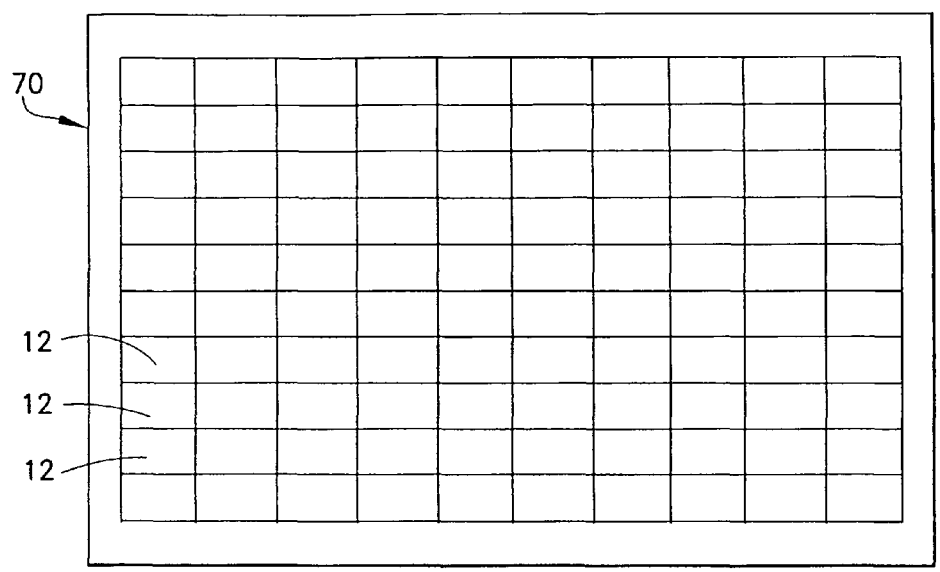
FIGS. 10A and 10B illustrate bottom and top plan views respectively of a panel that includes a plurality of substrates used in a package according to the present invention before the singulation thereof.
Figure 10B:
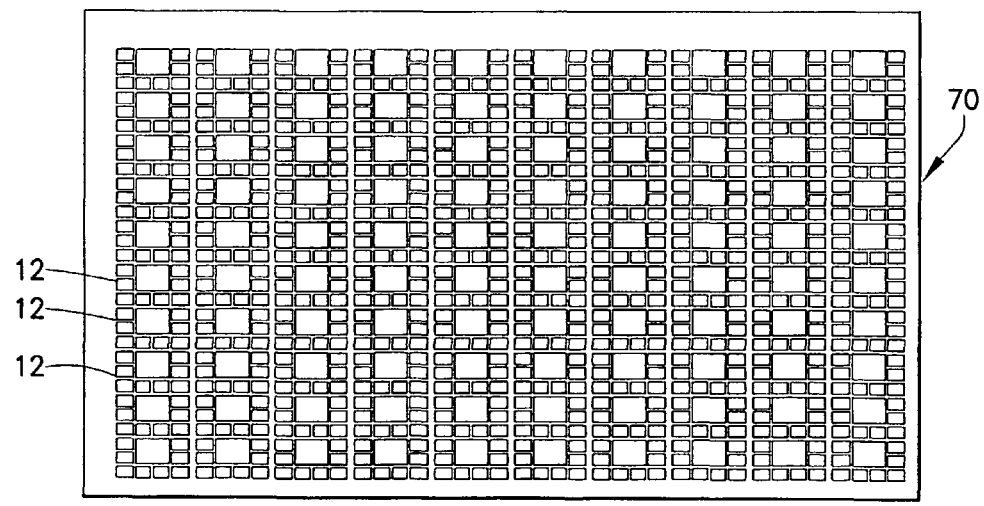
Figures 11A, 11B:
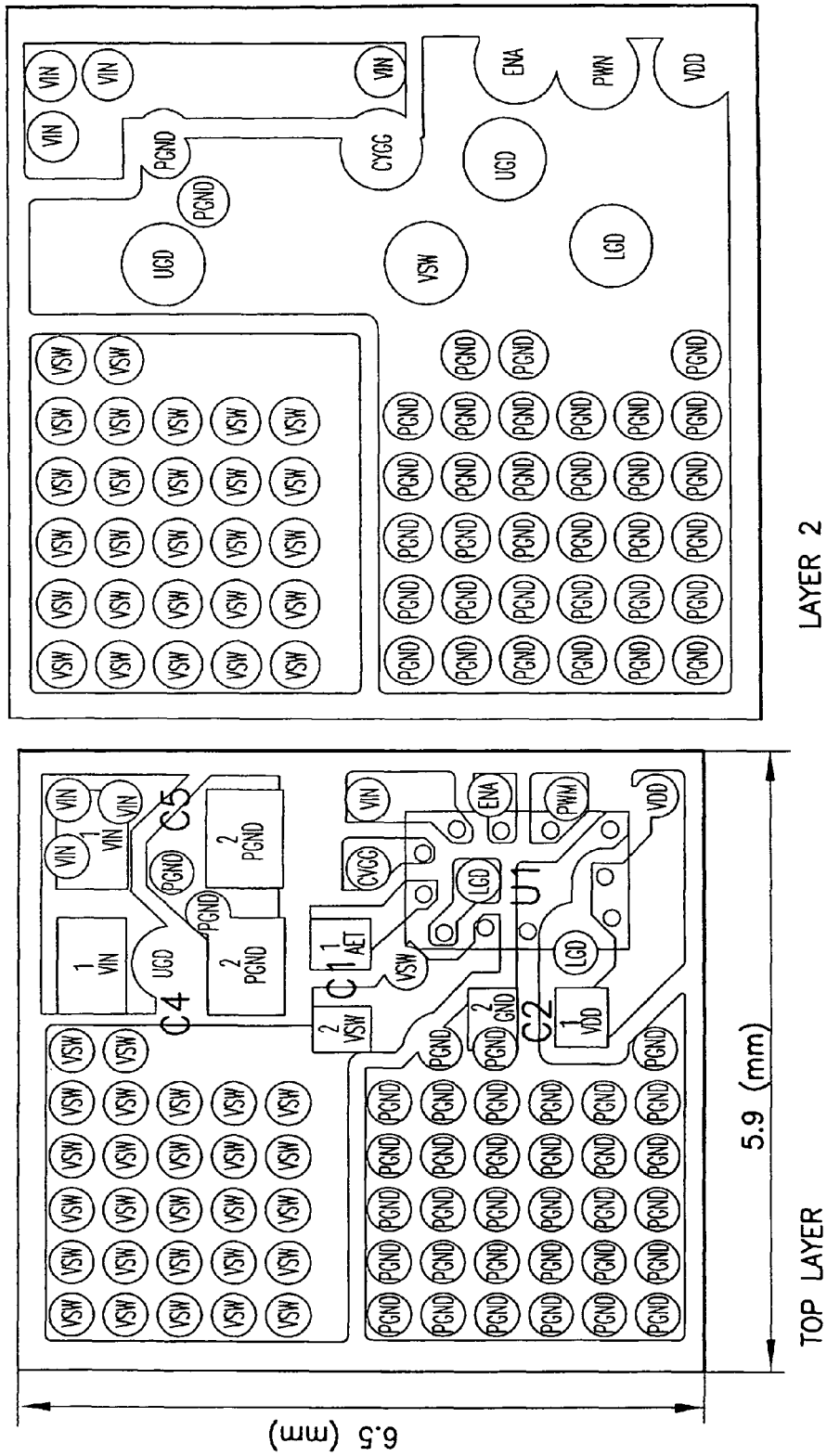

Substrates 12 may be produced as a panel 70 with many individual substrates 12 on this panel as illustrated by FIG. 10A-10B. Preferably, a laminate constituting panel 70 is pressed before any other processing takes place. So in the first instance the panel will be just plain copper on either side of a dielectric core. The patterning, drilling and plating of any vias take place later in the processing.

The way in which panels 70 are produced means that features can be incorporated on both sides of the panels. Etching the copper to expose the FR4 core material between the substrates means that it is very easy to singulate the devices from the panel after the die have been mounted and the assembly processing is complete.

The assembly of the die on substrate 12 can be carried out as follows:
  stencil print, solder or silver epoxy on first regions (e.g. 18', 20')
  bond die onto solder or silver epoxy
  dispense solder or silver epoxy onto rear (drain of die) (second embodiment)
  bond strap 38 to die
  reflow solder or cure epoxy stack
  underfill dies and strap assembly
  cure underfill
  pre-solder second regions (e.g. 18", 20") to provide contacts on similar plane A package according to the present invention addresses many of the issues that a direct connection component cannot. For example, flexibility to redistribute the contacts means that it can satisfy the surface insulation requirements of UL840 to some very high voltage levels. The redistribution effectively means that the cross-sectional area of the contact can be of a size to accommodate high power applications even though the die size is small. Yet the contacts given to the customer can be much bigger and pitched to aid an easy board assembly process.

In addition, the addition of a strap 38 means that the end user's pad outline can be maintained through the production life of the assembly even if the size of the die is reduced.

Moreover, pack plate 14 of the assembly can be tied to any potential on the assembly. For applications such as audio this can be very attractive as the back of the assembly can be tied to ground.

Packages according to the present invention are preferred for use with a thin die. While thicker die could be housed within the package, the interconnect solder would need to cover a larger standoff, which may not be desirable. If 100 μm die are used within the construction and a 50 μm thick die backplate is used the standoff height including die-bond material thickness is around the 200 μm mark.

The die thickness should generally be the same across all die, however on the integrated solutions the IC sits on a copper layer, which is on a low plane to the power copper layers. In this case the IC die needs to be thicker to match the plane set by the power die.

A package according to the present invention can include a back plate electrically and mechanically coupled to the drain electrode of the power die, or mounted to the back of the IC die. The backplate can be a thin piece of metal, e.g. plated copper, that includes a solderable finish layer good with silver adhesives and resistant to bias driven migration. A back plate, while not necessary, may allow the end user to retain the outline of its pads even if the size of the die is reduced in a given package.

To improve thermal performance, the copper that is connected directly to the die contacts of the die can be brought out onto the other surface of the die using vias, which in many cases means that more than one node will be presented onto the top of the finished package. Standard through hole vias, which are drilled and plated down the side walls, offer a reasonable level of performance, but filling a hole in the center with a thermally conductive plug can provide additional improvements. The vias can be plated over so that the surface above the vias appears as a continuous plane of metal. This is beneficial as the area below the connection areas between the die and the copper tracks can have vias without risking the connection material bleeding through the holes uncontrollably. Vias are preferably densely arranged under power die 10 to aid cooling.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package comprising:
    a semiconductor die that includes a first electrode on a surface thereof;
    a support plate having a first surface and a second surface opposite said first surface;
    an insulation body disposed directly on said first surface of said support plate; and
    a plurality of laterally spaced conductive pads disposed directly on said insulation body, a first one of said conductive pads including a first region electrically and mechanically coupled to said first electrode with a conductive adhesive body interposed between said first electrode and said first region and a second region readied for connection using a conductive adhesive body to a conductive pad external to said package;
    wherein said insulation body electrically insulates said plurality of laterally spaced conductive pads from said support plate.

2. The package of claim 1, wherein said semiconductor die includes a second electrode lateral to said first electrode on said first surface of said semiconductor die, a second one of said conductive pads including a first region electrically and mechanically coupled to said second electrode with a conductive adhesive body interposed between said second electrode and said first region of said second conductive pad and a second region readied for connection using a conductive adhesive body to a conductive pad external to said package.

3. The package of claim 1, wherein said semiconductor die includes a third electrode on another opposing surface thereof.

4. The package of claim 3, wherein said third electrode is readied for connection using a conductive adhesive body to a conductive pad external to said package.

5. The package of claim 3, further comprising a conductive clip electrically and mechanically coupled to said third electrode using a conductive adhesive body and to a third conductive pad of said plurality of laterally spaced conductive pads, said third conductive pad including a first region electrically and mechanically coupled to said conductive clip with a conductive adhesive body interposed between said conductive clip and said first region and a second region readied for connection using a conductive adhesive body to a conductive pad external to said package.

6. The package of claim 5, wherein said first region and said second region of each conductive pad are disposed on opposite surfaces of said conductive pad.

7. The package of claim 6, wherein said conductive pads extend beyond the peripheral edges of said insulation body.

8. The package of claim 1, wherein said conductive pads are confined within peripheral edges of said insulation body.

9. The package of claim 1, wherein each conductive pad includes a first region that is readied for electrical and mechanical connection using a conductive adhesive to a respective electrode of a semiconductor die, and a second region readied for electrical and mechanical connection using a conductive adhesive to a respective conductive pad external to said package, wherein said second regions are arranged along opposing edges of said insulation body.

10. The package of claim 9, wherein said insulation body is generally rectangular and said second regions are disposed at only two opposing edges of said insulation body.

11. The package of claim 9, wherein said insulation body is generally rectangular and said second regions are disposed along each edge of said insulation body.

12. The package of claim 11, wherein said semiconductor die is an IC.

13. The package of claim 1, wherein said support plate is metallic.

* * * * *